United States Patent
Nam et al.

(10) Patent No.: US 10,950,414 B2
(45) Date of Patent: *Mar. 16, 2021

(54) PLASMA PROCESSING APPARATUS AND METHOD OF MANUFACTURING SEMICONDUCTOR DEVICE USING THE SAME

(71) Applicant: Samsung Electronics Co., Ltd., Suwon-si (KR)

(72) Inventors: Sang Ki Nam, Seongnam-si (KR); Akira Koshiishi, Hwaseong-si (KR); Kwangyoub Heo, Yongin-si (KR); Sunggil Kang, Hwaseong-si (KR); Beomjin Yoo, Hwaseong-si (KR); Sungyong Lim, Seoul (KR); Vasily Pashkovskiy, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/983,178

(22) Filed: May 18, 2018

(65) Prior Publication Data
US 2019/0122866 A1  Apr. 25, 2019

(30) Foreign Application Priority Data
Oct. 23, 2017 (KR) .......................... 10-2017-0137421

(51) Int. Cl.
*H01L 21/00* (2006.01)
*C23C 16/00* (2006.01)
(Continued)

(52) U.S. Cl.
CPC .. *H01J 37/32422* (2013.01); *H01J 37/32568* (2013.01); *H01J 37/32596* (2013.01);
(Continued)

(58) Field of Classification Search
CPC .................................................. H01J 37/32596
See application file for complete search history.

(56) References Cited

U.S. PATENT DOCUMENTS 8,795,793 B2  8/2014  Choi et al.
8,900,402 B2  12/2014 Holland et al.
(Continued)

FOREIGN PATENT DOCUMENTS

JP  2005-072347 A  3/2005
JP  2013-125761 A  6/2013
(Continued)

*Primary Examiner* — Sylvia MacArthur
*Assistant Examiner* — Michelle Crowell
(74) *Attorney, Agent, or Firm* — Sughrue Mion, PLLC

(57) ABSTRACT

Disclosed are a plasma processing apparatus and a method of manufacturing a semiconductor device using the same. The plasma processing apparatus comprises a chamber, an electrostatic chuck in the chamber and loading a substrate, a plasma electrode generating an upper plasma on the electrostatic chuck; and a hollow cathode between the plasma electrode and the electrostatic chuck, wherein the hollow cathode generates a lower plasma below the upper plasma. The hollow cathode comprises cathode holes each having a size less than a thickness of a plasma sheath of the upper plasma.

14 Claims, 13 Drawing Sheets

(51) Int. Cl.
*H01J 37/32* (2006.01)
*H01L 21/66* (2006.01)
*H01L 21/3065* (2006.01)
*H01L 21/683* (2006.01)

(52) U.S. Cl.
CPC .. *H01J 37/32623* (2013.01); *H01J 37/32715* (2013.01); *H01L 21/3065* (2013.01); *H01L 21/6831* (2013.01); *H01L 22/26* (2013.01); *H01J 2237/334* (2013.01); *H01L 22/12* (2013.01); *H01L 22/20* (2013.01)

(56) References Cited

U.S. PATENT DOCUMENTS

| | | | |
|---|---|---|---|
| 8,900,403 | B2 | 12/2014 | Holland et al. |
| 9,190,289 | B2 * | 11/2015 | Hudson ............ H01J 37/32596 |
| 9,214,357 | B1 | 12/2015 | Ji et al. |
| 9,230,819 | B2 * | 1/2016 | Paterson ............ H01L 21/3065 |
| 10,347,468 | B2 * | 7/2019 | Lee |
| 2001/0006093 | A1 * | 7/2001 | Tabuchi ............... C23C 16/24 |
| | | | 156/345.43 |
| 2002/0000202 | A1 * | 1/2002 | Yuda .................. C23C 16/402 |
| | | | 118/723 ER |
| 2005/0051517 | A1 * | 3/2005 | Oehrlein ........... H01J 37/32623 |
| | | | 216/67 |
| 2006/0042545 | A1 * | 3/2006 | Shibata ............ H01J 37/32009 |
| | | | 118/722 |
| 2007/0163440 | A1 * | 7/2007 | Kim ................. C23C 16/45565 |
| | | | 96/52 |
| 2010/0006226 | A1 * | 1/2010 | Cho .................. H01J 37/32009 |
| | | | 156/345.33 |
| 2011/0000529 | A1 | 1/2011 | Suzuki |
| 2012/0258555 | A1 * | 10/2012 | Holland ............ H01J 37/32596 |
| | | | 438/5 |
| 2012/0258601 | A1 * | 10/2012 | Holland ............ H01J 37/32357 |
| | | | 438/729 |
| 2012/0258606 | A1 * | 10/2012 | Holland ............ H01J 37/32357 |
| | | | 438/798 |
| 2012/0258607 | A1 * | 10/2012 | Holland ............ H01J 37/32357 |
| | | | 438/798 |
| 2015/0044878 | A1 | 2/2015 | Holland et al. |
| 2016/0064232 | A1 * | 3/2016 | Berry, III ......... H01J 37/32532 |
| | | | 438/712 |
| 2016/0064260 | A1 * | 3/2016 | Berry, III ......... H01L 21/67069 |
| | | | 438/712 |
| 2016/0160351 | A1 * | 6/2016 | Seo ....................... C23C 16/505 |
| | | | 118/723 R |
| 2016/0240346 | A1 * | 8/2016 | Oba .......................... H05H 1/30 |
| 2019/0122860 | A1 * | 4/2019 | Lee ..................... H01J 37/3233 |
| 2019/0122867 | A1 * | 4/2019 | Nam .................. H01J 37/32596 |
| 2019/0279846 | A1 * | 9/2019 | Lee ..................... H01J 37/3244 |

FOREIGN PATENT DOCUMENTS

| | | |
|---|---|---|
| JP | 5378193 B2 | 12/2013 |
| JP | 2017-022392 A | 1/2017 |
| JP | 6065111 B2 | 1/2017 |
| WO | WO 2014/188576 A1 | 11/2014 |

* cited by examiner

US 10,950,414 B2

PLASMA PROCESSING APPARATUS AND METHOD OF MANUFACTURING SEMICONDUCTOR DEVICE USING THE SAME

CROSS-REFERENCE TO RELATED APPLICATIONS

This U.S. nonprovisional patent application claims priority under 35 U.S.C. § 119 of Korean Patent Application No. 10-2017-0137421 filed on Oct. 23, 2017, the entire contents of which are hereby incorporated by reference.

BACKGROUND

Inventive concepts relate to apparatus for and method of manufacturing a semiconductor device, and more particularly, to a plasma processing apparatus and a method of manufacturing a semiconductor device using the same.

In general, a semiconductor device is manufactured by employing a plurality of unit processes. The unit processes may include a thin-layer deposition process, a lithography process, and an etching process. Plasma may be mainly used to perform the thin-layer deposition process and the etching process. The plasma may treat substrates at high temperatures. High frequency power is generally used to produce the plasma.

SUMMARY

Some embodiments of inventive concepts provide a plasma processing apparatus capable of controlling a ratio of ions and radicals of a reaction gas and a method of manufacturing a semiconductor device using the same.

According to exemplary embodiments of inventive concepts, a plasma processing apparatus may comprise: a chamber; an electrostatic chuck in the chamber and loading a substrate; a plasma electrode generating an upper plasma on the electrostatic chuck; and a hollow cathode between the plasma electrode and the electrostatic chuck, wherein the hollow cathode generates a lower plasma below the upper plasma. The hollow cathode may comprise cathode holes each having a size less than a thickness of a plasma sheath of the upper plasma.

According to exemplary embodiments of inventive concepts, a method of manufacturing a semiconductor device may comprise: providing a reaction gas into a chamber; generating an upper plasma on a hollow cathode in the chamber by providing the reaction gas with a high-frequency power output; and generating a lower plasma in cathode holes of the hollow cathode by respectively providing a bias power output to at least one bottom electrode and a source power output to at least one top electrode of the hollow cathode. The step of generating the upper plasma may comprise filtering ions in the upper plasma and allowing radicals in the upper plasma to pass through the cathode holes.

DETAILED DESCRIPTION OF EMBODIMENTS

Figure 1:
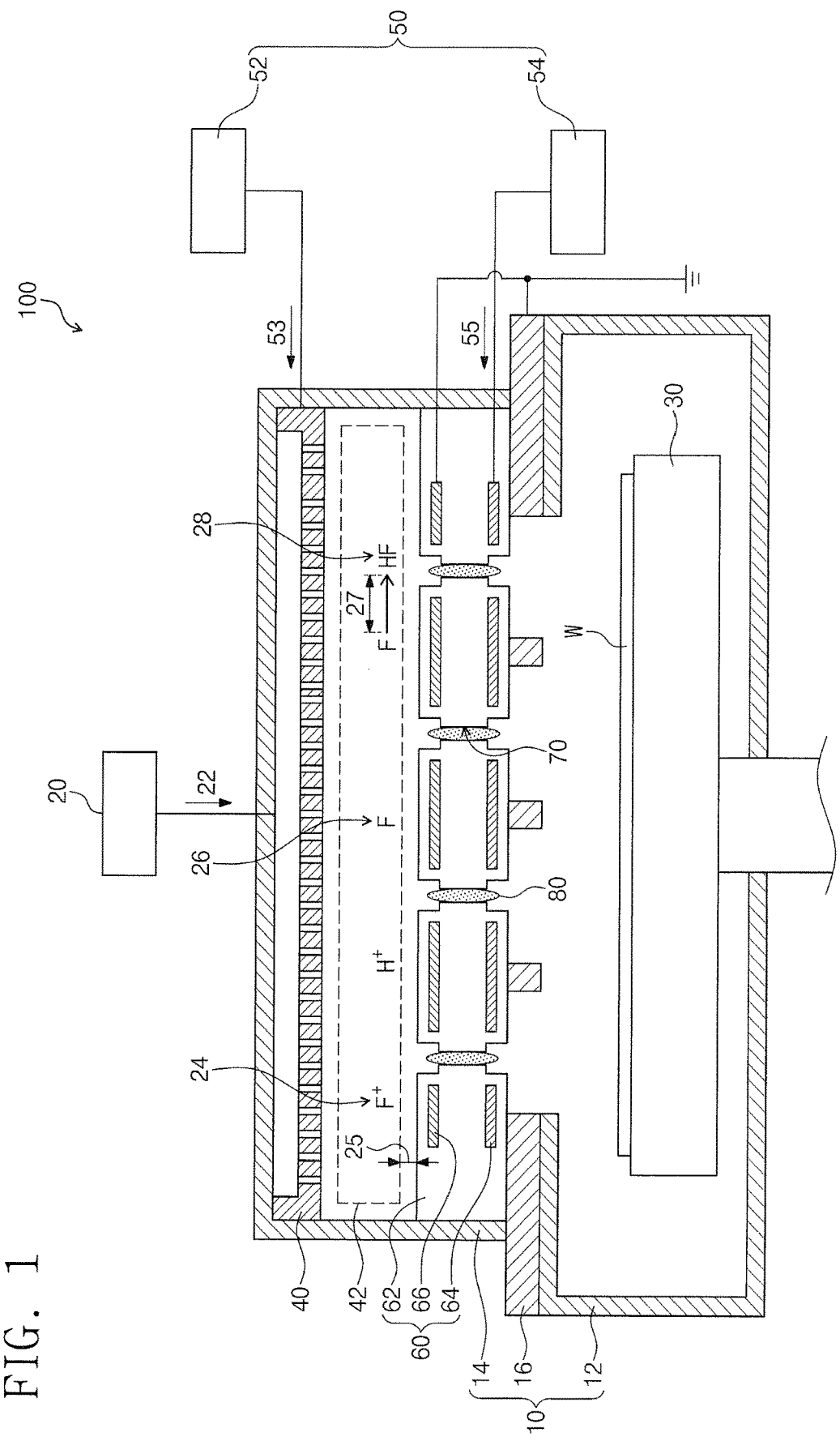
FIG. 1 illustrates a schematic diagram showing a plasma processing apparatus according to exemplary embodiments of inventive concepts.

FIG. 1 shows a plasma processing apparatus 100 according to inventive concepts.

Referring to FIG. 1, the plasma processing apparatus 100 according to inventive concepts may be or include a capacitively coupled plasma (CCP) processing apparatus. Alternatively, the plasma processing apparatus 100 may be or include a microwave plasma apparatus or an inductively coupled plasma (ICP) apparatus. In an embodiment, the plasma processing apparatus 100 may include a chamber 10, a gas supply 20, an electrostatic chuck 30, a plasma electrode 40, a power supply 50, and a hollow cathode 60. A substrate W may be provided in the chamber 10. The gas supply 20 may provide a reaction gas 22 into the chamber 10. The substrate W may be loaded on the electrostatic chuck 30. The plasma electrode 40 may use a high-frequency power output 53 to generate an upper plasma 42. The power supply 50 may produce the high-frequency power output 53, a bias power output 55, and optionally a source power output 57 which is discussed below. The hollow cathode 60 may use the bias power output 55 to generate a lower plasma 80. The lower plasma 80 may locally etch the substrate W. The upper plasma 42 and the lower plasma 80 may control an etch rate of the substrate W. The upper plasma 42 and the lower plasma 80 will be discussed in detail below.

The chamber 10 may provide the substrate W with an isolated space from the outside. For example, the chamber 10 may have a pressure ranging from about 3 to 10 Torr. In an embodiment, the chamber 10 may include a lower housing 12, an upper housing 14, and a ground plate 16. The upper housing 14 may be disposed on the lower housing 12. The ground plate 16 may be disposed between the lower housing 12 and the upper housing 14. When the lower housing 12 moves down from the ground plate 16, the substrate W may be provided on the electrostatic chuck 30. After that, the lower housing 12 may move up to associate with the ground plate 16.

The gas supply 20 may be engaged with the upper housing 14. The gas supply 20 may provide the reaction gas 22 into the upper housing 14, and thus hollow cathode 60 may be supplied with the reaction gas 22. The reaction gas 22 may include an etching gas (e.g., $SF_6$, HF, HCl, $CH_4$) of the substrate W, an inert gas (e.g., Ar or He), or a purge gas (e.g., $N_2$). Alternatively, the reaction gas 22 may include a deposition gas (e.g., $SiH_4$ or $NH_3$).

The electrostatic chuck 30 may be placed in the lower housing 12. The electrostatic chuck 30 may use an electrostatic force to hold the substrate W. Alternatively, the electrostatic chuck 30 may concentrate the lower plasma 80 on the substrate W. An etch rate of the substrate W may increase depending on intensities of the upper plasma 42 and the lower plasma 80.

The plasma electrode 40 may be placed in the upper housing 14 and on the ground plate 16. The plasma electrode 40 may include a shower head spraying the reaction gas 22 on the hollow cathode 60. For example, when the high-frequency power output 53 is provided to the plasma electrode 40, the upper plasma 42 may be generated between the plasma electrode 40 and the hollow cathode 60. In an embodiment, the upper plasma 42 may include ions 24 and radicals 26 of the reaction gas 22. The ions 24 may include a hydrogen ion ($H^+$) and/or a fluorine ion ($F^+$). The radicals 26 may include a hydrogen radical (H), a fluorine radical (F), a chlorine radical (Cl.), and/or a methane radical ($CH_3$.). The ions 24 may have reactivity greater than that of the radicals 26. Compared to the radicals 26, the ions 24 may etch the substrate W at high rate. Meanwhile, the ions 24 may easily damage the substrate W. The radicals 26 may etch and minimally damage the substrate W. A production amount of the ions 24 and the radicals 26 may be proportional to the intensity of the upper plasma 42. The radicals 26 may have a mean free path 27, and may be converted into gas molecules 28 of the reaction gas 22. For example, the radicals 26 may have a mean free path 27 with a distance equal to or greater than about 5 mm.

The upper plasma 42 generated may be separated from the plasma electrode 40, the upper housing 14, and/or the hollow cathode 60 by a distance equal to or greater than a thickness of a plasma sheath 25 of the upper plasma 42. The plasma sheath 25 may be defined to refer to an area and/or space which is located outside the upper plasma 42 and where electrons are depleted. Negative charges in the plasma sheath 25 may focus the ions 24 into the upper plasma 42. The ions 24 may be rarely present in the plasma sheath 25. For example, the plasma sheath 25 may be about 0.5 mm thick.

The power supply 50 may provide the high-frequency power output 53 to the plasma electrode 40, and provide the bias power output 55 to the hollow cathode 60. In an embodiment, the power supply 50 may include a high-frequency power supply 52 and a bias power supply 54. The high-frequency power supply may supply the high-frequency power output 53 to the plasma electrode 40. The bias power supply 54 may provide the bias power output 55 to the hollow cathode 60.

The hollow cathode 60 may be disposed between the ground plate 16 and the plasma electrode 40. The hollow cathode 60 may be installed in parallel to the plasma electrode 40 and the electrostatic chuck 30. When the hollow cathode 60 is supplied with the bias power output 55, the lower plasma 80 may be generated in cathode holes 70 which will be discussed below.

Figure 2:
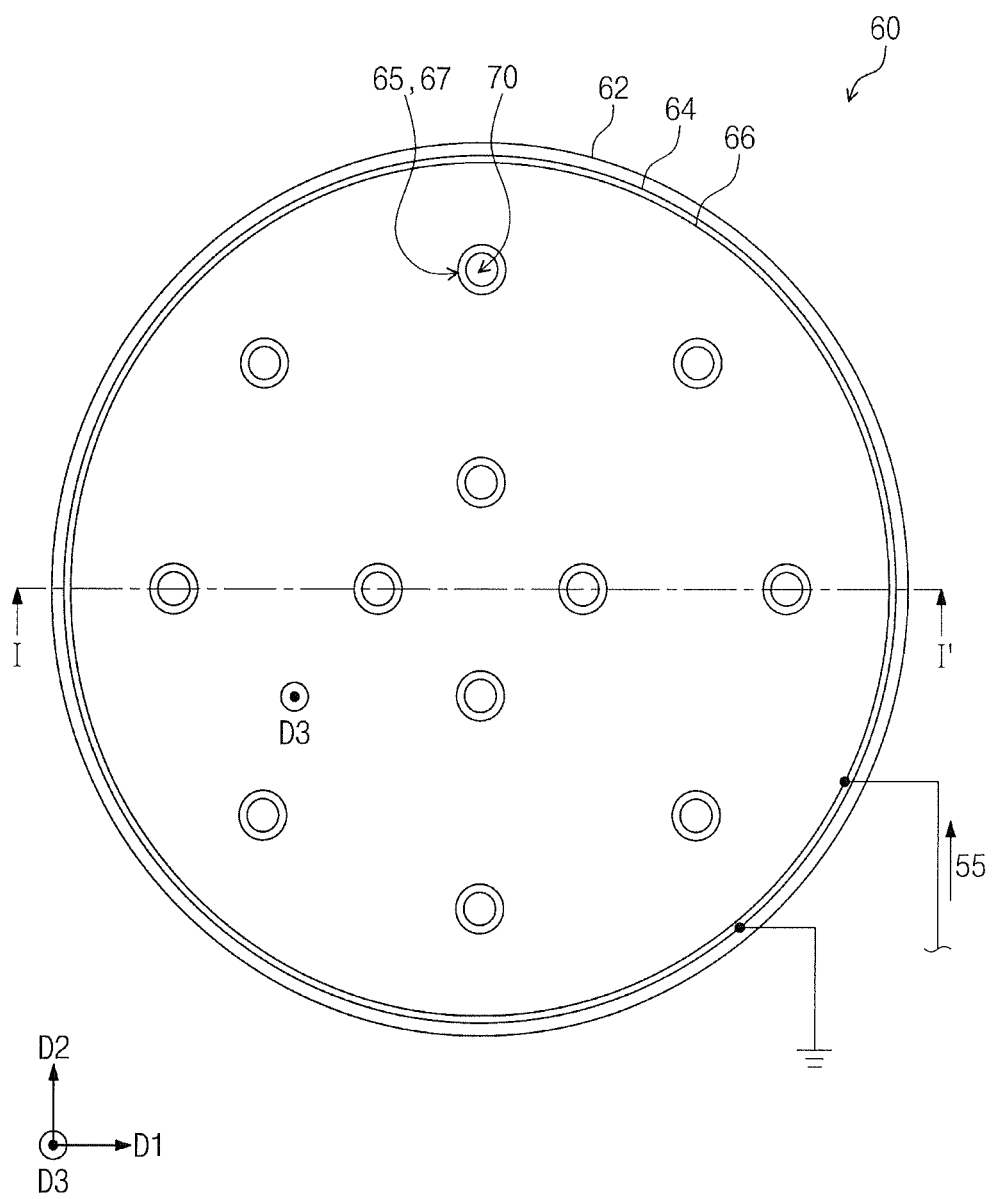
FIG. 2 illustrates a plan view showing an example of a hollow cathode shown in FIG. 1.
Figure 3:
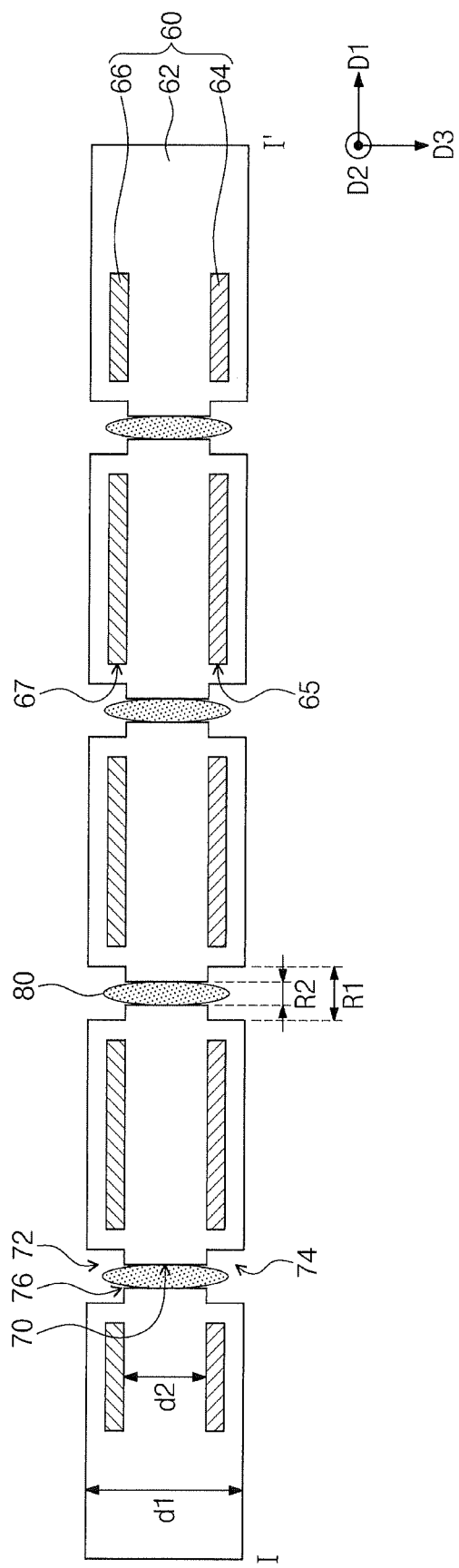
FIGS. 3 and 4 illustrate cross-sectional views taken along line I-I' of FIG. 2.

FIG. 2 shows an example of the hollow cathode 60 shown in FIG. 1. FIG. 3 shows a cross-sectional view taken along line I-I' of FIG. 2.

Referring to FIGS. 1 to 3, the hollow cathode 60 may include an insulation plate 62, a bottom electrode 64, and a top electrode 66.

The insulation plate 62 may include ceramic dielectric (e.g. $Al_2O_3$). In an embodiment, the insulation plate 62 may have a thickness d1 greater than the mean free path 27 of the radicals 26 in the upper plasma 42. The thickness d1 of the insulation plate 62 may be greater than about 5 mm. For example, the thickness d1 of the insulation plate 62 may be about 1 cm. In an embodiment, the insulation plate 62 may have cathode holes 70. Each of the cathode holes 70 may have a size R2 less than the thickness of the plasma sheath 25. When each of the cathode holes 70 has a circular shape, the size R2 may be a diameter. When each of the cathode holes 70 has a polygonal shape, the size R2 may be a diagonal length and/or a side length. For example, the size R2 of each of the cathode holes 70 may be equal to or less than about 0.5 mm. When the lower plasma 80 is not be generated in the cathode holes 70, the ions 24 of the upper plasma 42 may not pass through the cathode holes 70. For example, the cathode holes 70 may filter the ions 24 of the upper plasma 42. The radicals 26 may pass through the cathode holes 70, and may then be provided to the substrate W. A generated amount and/or a provided amount of the radicals 26 may increase in proportion to the high-frequency power output 53. The radicals 26 may etch and minimally damage the substrate W. The high-frequency power output 53 may be used as a pushing power that provides the radicals 26 to the substrate W.

The bottom electrode 64 may be disposed in the insulation plate 62. The bottom electrode 64 may include a disc-shaped plate electrode. The bottom electrode 64 may be connected to the bias power supply 54. The bottom electrode 64 may have lower holes 65. In a plan view, the cathode holes 70 may be disposed concentrically in alignment with the lower holes 65.

The top electrode 66 may be disposed above the bottom electrode 64 and in the insulation plate 62. The top electrode 66 may have the same shape as that of the bottom electrode 64. The top electrode 66 may include a disc-shaped plate electrode. The top electrode 66 may overlap or may be aligned with the bottom electrode 64. The top electrode 66 may be electrically grounded. The top electrode 66 may have upper holes 67. The upper holes 67 may be aligned on the lower holes 65. In a plan view, the cathode holes 70 may be disposed concentrically in alignment with the upper holes 67.

When the bias power supply 54 provides the bias power output 55 to the bottom electrode 64, the lower plasma 80 may be generated in the cathode holes 70. For example, the lower plasma 80 may mainly produce the ions 24 in the reaction gas 22. A generated amount of the ions 24 may increase in proportion to the bias power output 55. The ions 24 may have an etch rate to the substrate W greater than an etch rate to the substrate W of the radicals 26. The bias power output 55 may be used as a pulling power that pulls the ions 24 toward the substrate W. The high-frequency power output 53 and the bias power output 55 may control amounts of the radicals 26 and the ions 24 of the reaction gas 22. A ratio between the bias power output 55 and the high-frequency power output 53 may correspond to a ratio between the ions 24 and the radicals 26. For example, when the bias power output 55 is eighty percent and the high-frequency power output 53 is twenty percent of total power supplied from the power supply 50, the reaction gas 22 may be provided on the substrate W with about eighty percent of the ions 24 and about twenty percent of the radicals 26. The ratio between the bias power output 55 and the high-frequency power output 53 may be proportional to the etch rate of the substrate W. The bias power output 55 and the high-frequency power output 53 may be selected based on types of an etching target. For example, when the substrate W is formed of a metal layer and a surface oxide on the metal layer, the plasma processing apparatus 100 may use the bias power output 55 to etch the surface oxide, and use the high-frequency power output 53 to etch the metal layer without damage.

Referring to FIG. 3, each of the cathode holes 70 of the insulation plate 62 may have an entrance opening 72, an exit opening 74, and stepped inner walls 76. The entrance opening 72 may be disposed above or on the top electrode 66. The exit opening 74 may be disposed below or on the bottom electrode 64. The stepped inner walls 76 may be disposed between the entrance opening 72 and the exit opening 74. The stepped inner walls 76 may protrude toward an inside of the cathode hole 70. The stepped inner walls 76 may be aligned in a first direction D1 with the bottom electrode 64 and the top electrode 66. A distance d2 and/or height between the stepped inner walls 76 may correspond to a distance between the bottom electrode 64 and the top electrode 66. The distance d2 between the stepped inner walls 76 may be less than the mean free path 27 of the radicals 26. Before the radicals 26 are converted into the gas molecules 28 due to collisions with the stepped inner walls 76, the cathode holes 70 may allow the radicals 26 to pass therethrough. The distance d2 between the stepped inner walls 76 may be less than 5 mm.

Each of the entrance opening 72 and the exit opening 74 may have a size R1 greater than the size R2 of each of the cathode holes 70 between the stepped inner walls 76. For example, each of the cathode holes 70 may increase in size at the entrance opening 72 and the exit opening 74. The size R2 of the cathode hole 70 between the stepped inner walls 76 may be less than the thickness of the plasma sheath 25. For example, the size R2 of the cathode hole 70 between the stepped inner walls 76 may be equal to or less than 0.5 mm.

Figure 4:
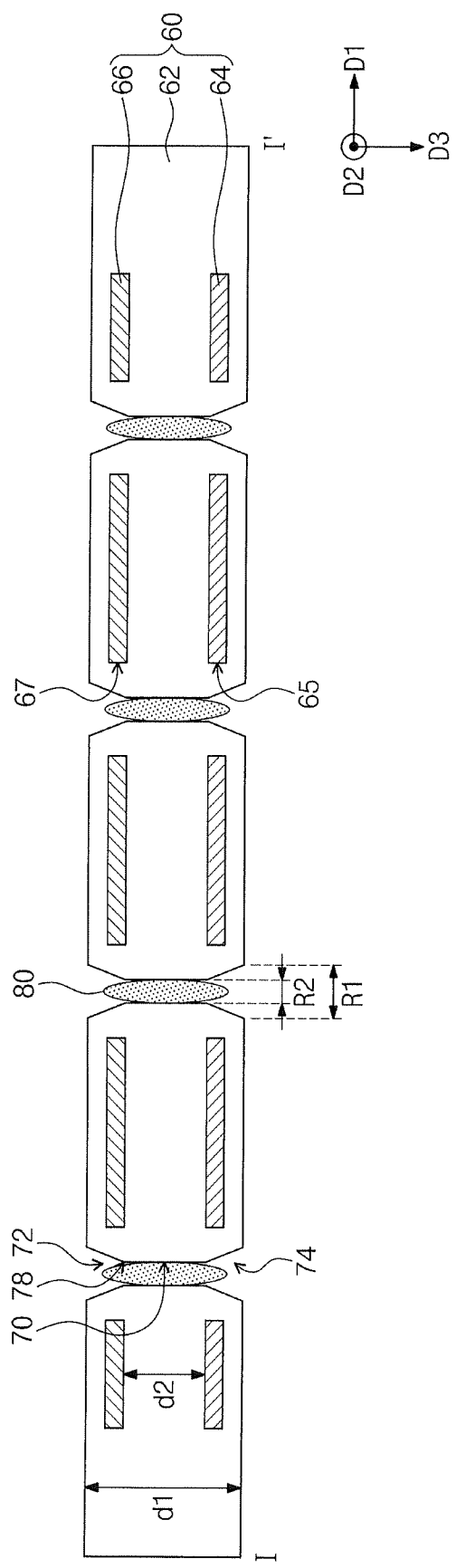

FIG. 4 shows an example of the hollow cathode 60 shown in FIG. 2.

Referring to FIG. 4, each of the cathode holes 70 of the hollow cathode 60 may have inclined inner walls 78 between entrance openings 72 and exit openings 74. The inclined inner walls 78 may protrude toward an inside of the cathode hole 70. A distance d2 and/or height between the inclined inner walls 78 may correspond to a distance between the bottom electrode 64 and the top electrode 66. The distance d2 between the inclined inner walls 78 may be less than the mean free path 27. For example, the distance d2 between the inclined inner walls 78 may be less than 5 mm. The size R2 of the cathode hole 70 between the inclined inner walls 78 may be less than a size R1 of each of the entrance openings 72 and exit openings 74. The size R2 of the cathode hole 70 between the inclined inner walls 78 may be less than the thickness of the plasma sheath 25. For example, the size R2 of the cathode hole 70 between the inclined inner walls 78 may be equal to or less than 0.5 mm.

Figure 5:
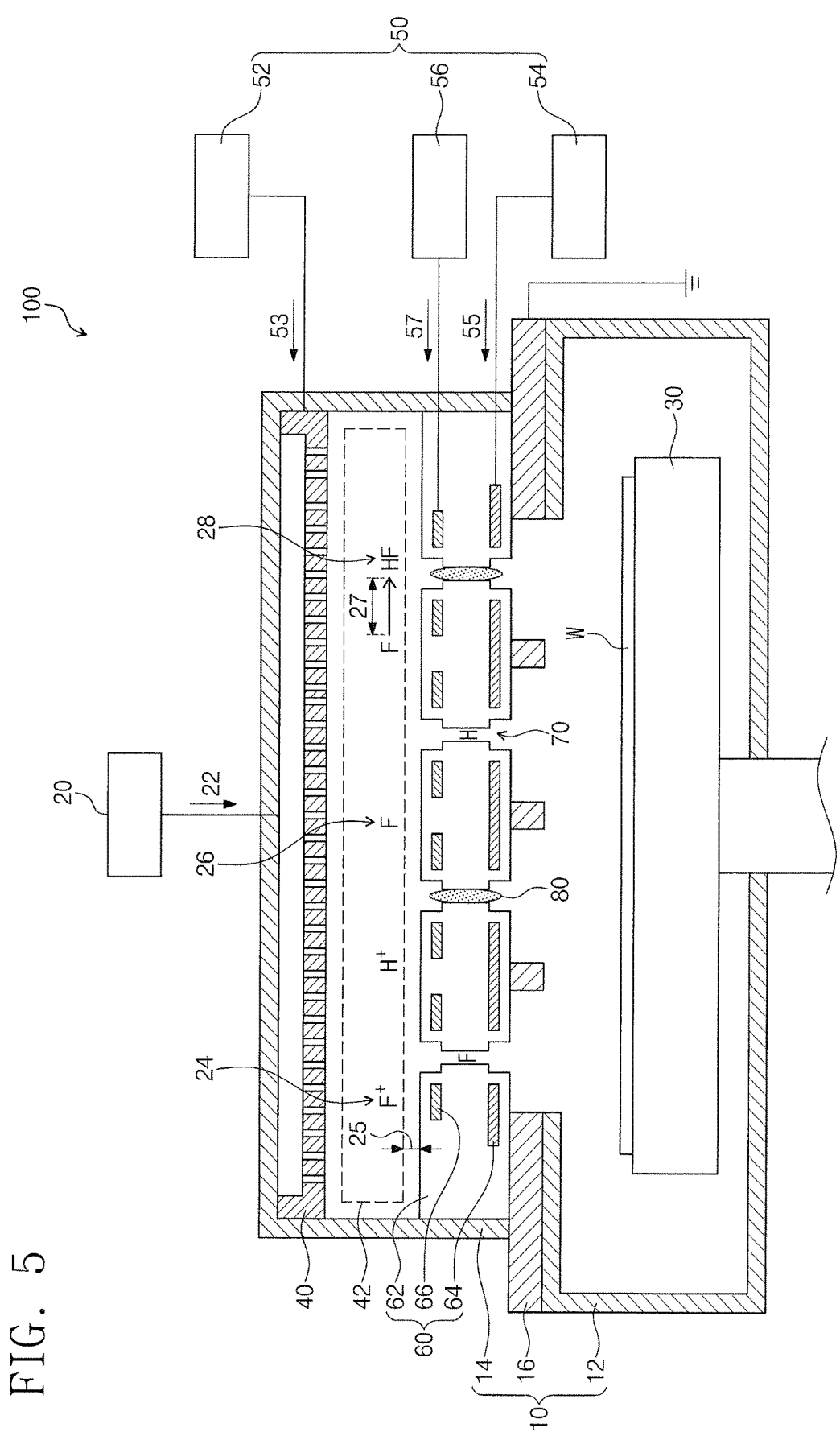
FIG. 5 illustrates a schematic diagram showing a plasma processing apparatus according to exemplary embodiments of inventive concepts.
Figure 6:
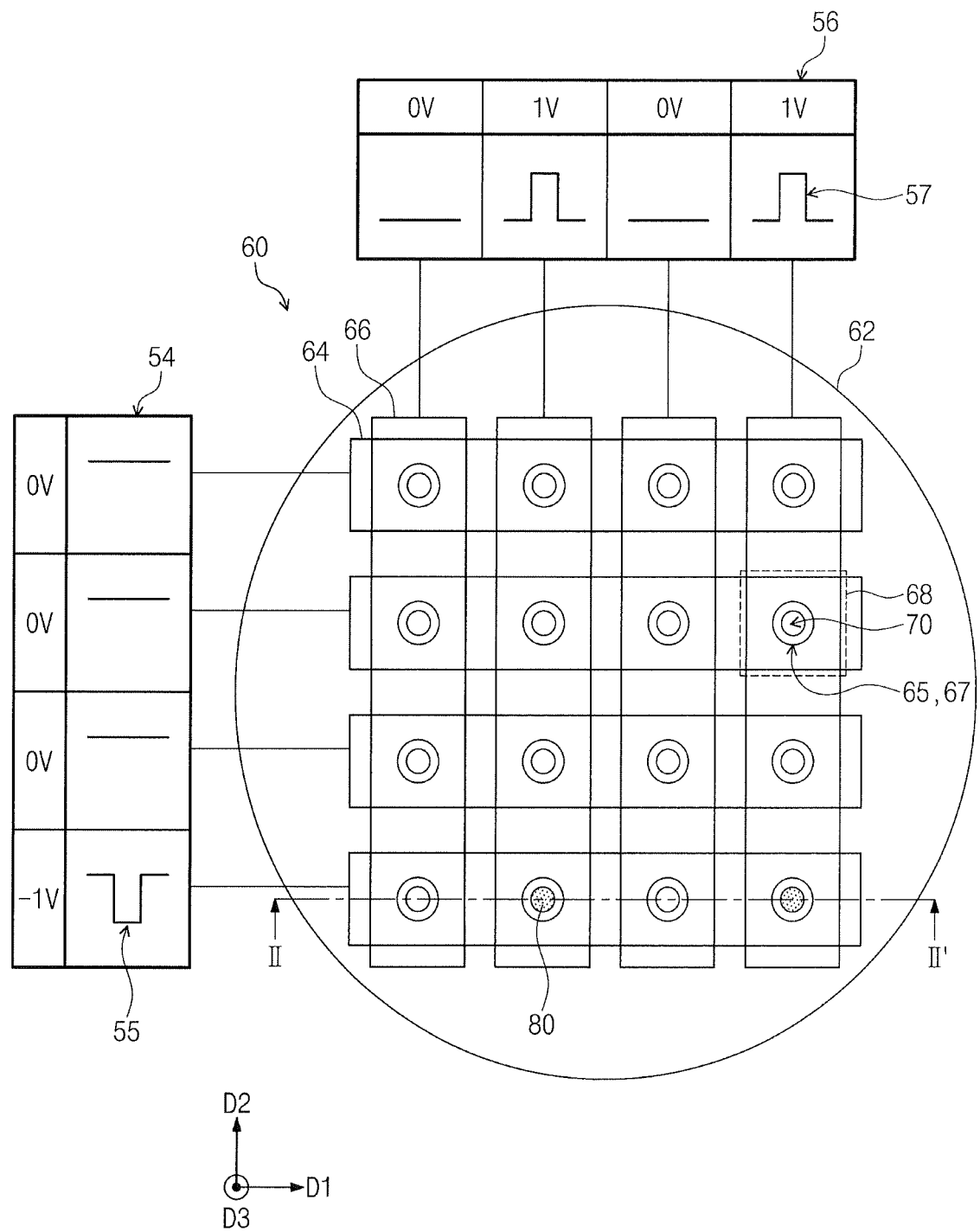
FIG. 6 illustrates a plan view showing an example of a hollow cathode shown in FIG. 5.
Figure 7:
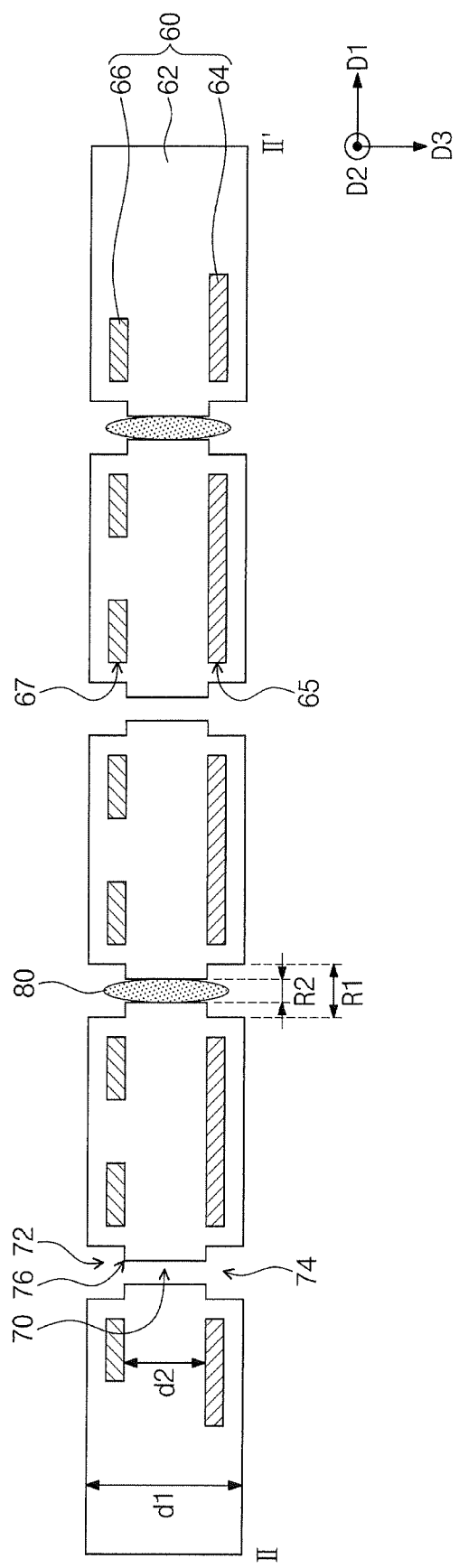
FIG. 7 illustrates a cross-sectional view taken along line II-II' of FIG. 6.

FIG. 5 shows a plasma processing apparatus 100 according to inventive concepts. FIG. 6 shows an example of the hollow cathode 60 shown in FIG. 5. FIG. 7 shows a cross-sectional view taken along line II-II' of FIG. 6.

Referring to FIG. 5, a source power supply 56 may be included in the power supply 50 of the plasma processing apparatus 100 according to inventive concepts. Other components, such as the chamber 10, the gas supply 20, the electrostatic chuck 30, and the plasma electrode 40, may be configured identically to those discussed with reference to FIG. 1.

Referring to FIGS. 5 and 6, the source power supply 56 may be connected to the hollow cathode 60. The source power supply 56 may provide the hollow cathode 60 with a source power output 57. The high-frequency power supply 52 and the bias power supply 54 may be configured identically to those discussed with reference to FIG. 1.

Referring to FIG. 6, the hollow cathode 60 may include a plurality of bottom electrodes 64 extending in a first direction D1, and include a plurality top electrodes 66 extending in a second direction D2. The bottom electrodes 64 may be connected to the bias power supply 54. The top electrodes 66 may be connected to the bias power supply 54.

The cathode holes 70 of the insulation plate 62, the lower holes 65 of the bottom electrodes 64, and the upper holes 67 of the top electrodes 66 may be disposed at intersections 68 between the bottom electrodes 64 and the top electrodes 66 in a plan view. The cathode holes 70, the lower holes 65, and the upper holes 67 may be disposed concentrically in alignment around centers of the intersections 68.

Referring to FIGS. 6 and 7, when the bias power supply 54 and the source power supply 56 apply the bias power output 55 to the bottom electrodes and the source power output 57 to the top electrodes 66, the lower plasma 80 may be generated in the cathode holes 70. The lower plasma 80 may be selectively generated at the intersections 68 between the bottom electrodes 64, provided with the bias power output 55, and the top electrodes 66, provided with the source power output 57. For example, as illustrated in FIG. 6, when the bias power output 55 having a voltage of about −1 V is applied to the bottom electrode 64 located first from the bottom, and when the source power output 57 having a voltage of about 1 V is applied to the top electrodes 66 located second and fourth from the left, the lower plasma 80 may be generated in the cathode holes 70 at the intersections 68 whose positional information are expressed by coordinate values (2, 1) and (4, 1).

Figure 8:
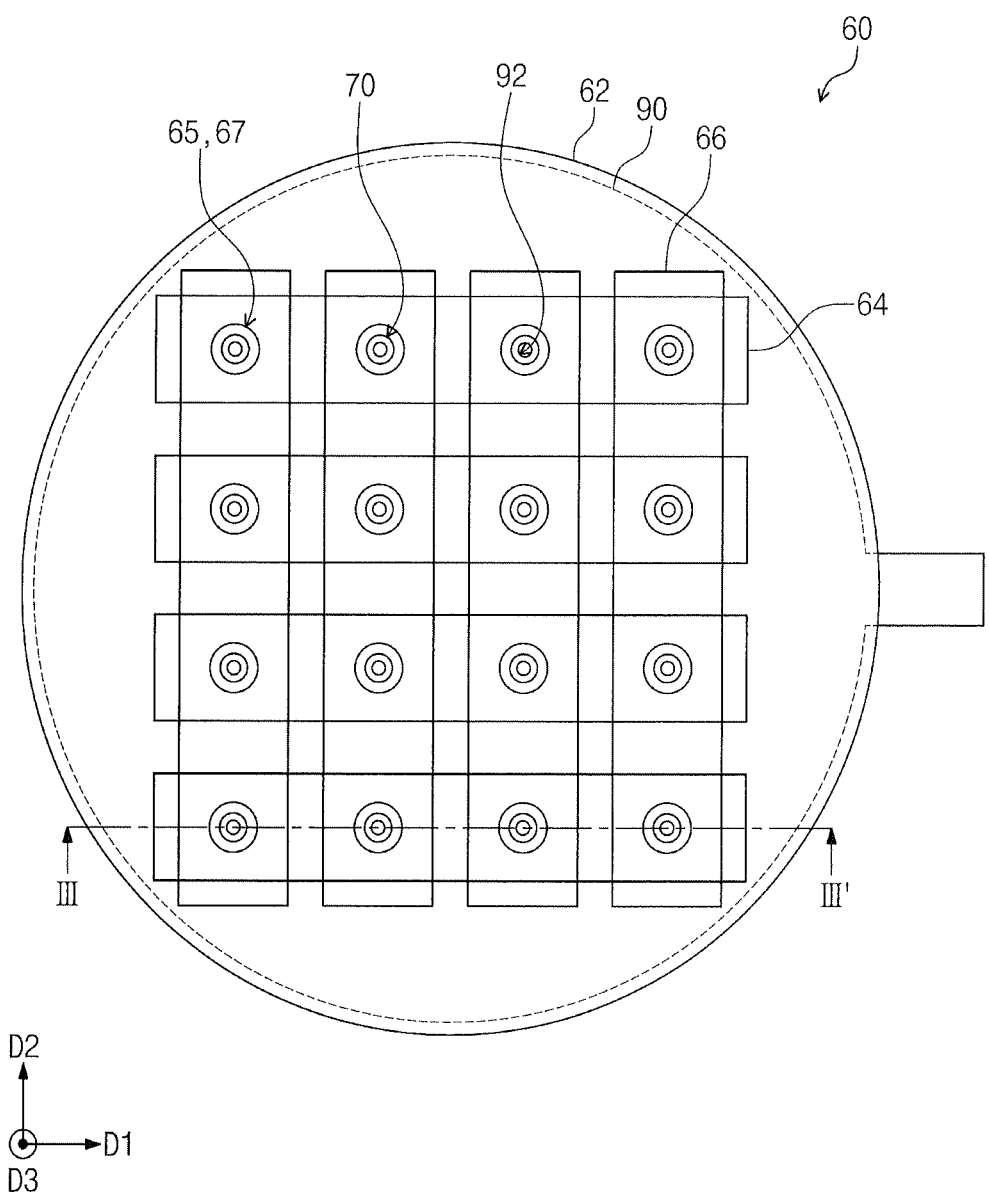
FIG. 8 illustrates a plan view showing an example of a hollow cathode shown in FIG. 5.
Figure 9:
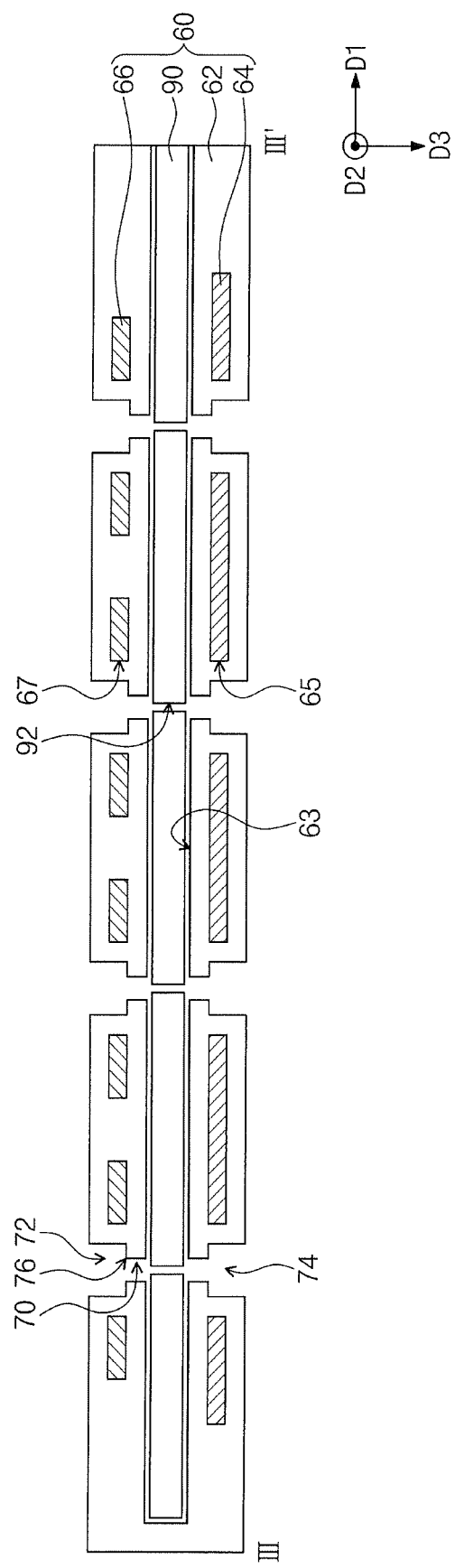
FIG. 9 illustrates a cross-sectional view taken along line of FIG. 8.

FIG. 8 shows an example of the hollow cathode 60 shown in FIG. 5. FIG. 9 shows a cross-sectional view taken along line III-III' of FIG. 8.

Referring to FIGS. 8 and 9, the hollow cathode 60 may include a shutter plate 90 in the insulation plate 62. The bottom electrodes 64 and the top electrodes 66 may be configured identically to those discussed with reference to FIG. 6, or the bottom electrode 64 and the top electrode may be configured identically to those discussed with reference to FIG. 2 (not shown).

The insulation plate 62 may have a gap 63 between the bottom electrodes 64 and the top electrodes 66. The gap 63 may extend in a direction intersecting extending directions of the cathode holes 70. For example, when the cathode holes 70 extend in a third direction D3, the gap 63 may extend either in the first direction D1 or in the second direction D2.

The shutter plate 90 may be provided in the gap 63. The shutter plate 90 may include ceramic dielectric (e.g. $Al_2O_3$). The shutter plate 90 may have shutter holes 92. The shutter holes 92 may be disposed concentrically in alignment with the cathode holes 70, when viewed in plan. The shutter holes 92 may have a size less than that of the cathode holes 70. For example, each of the shutter holes 92 may have a size equal to or less than about 0.5 mm. Alternatively, the shutter holes 92 may have the same size as that of the cathode holes 70. The lower plasma 80 may be generated in the shutter holes 92.

Figure 10:
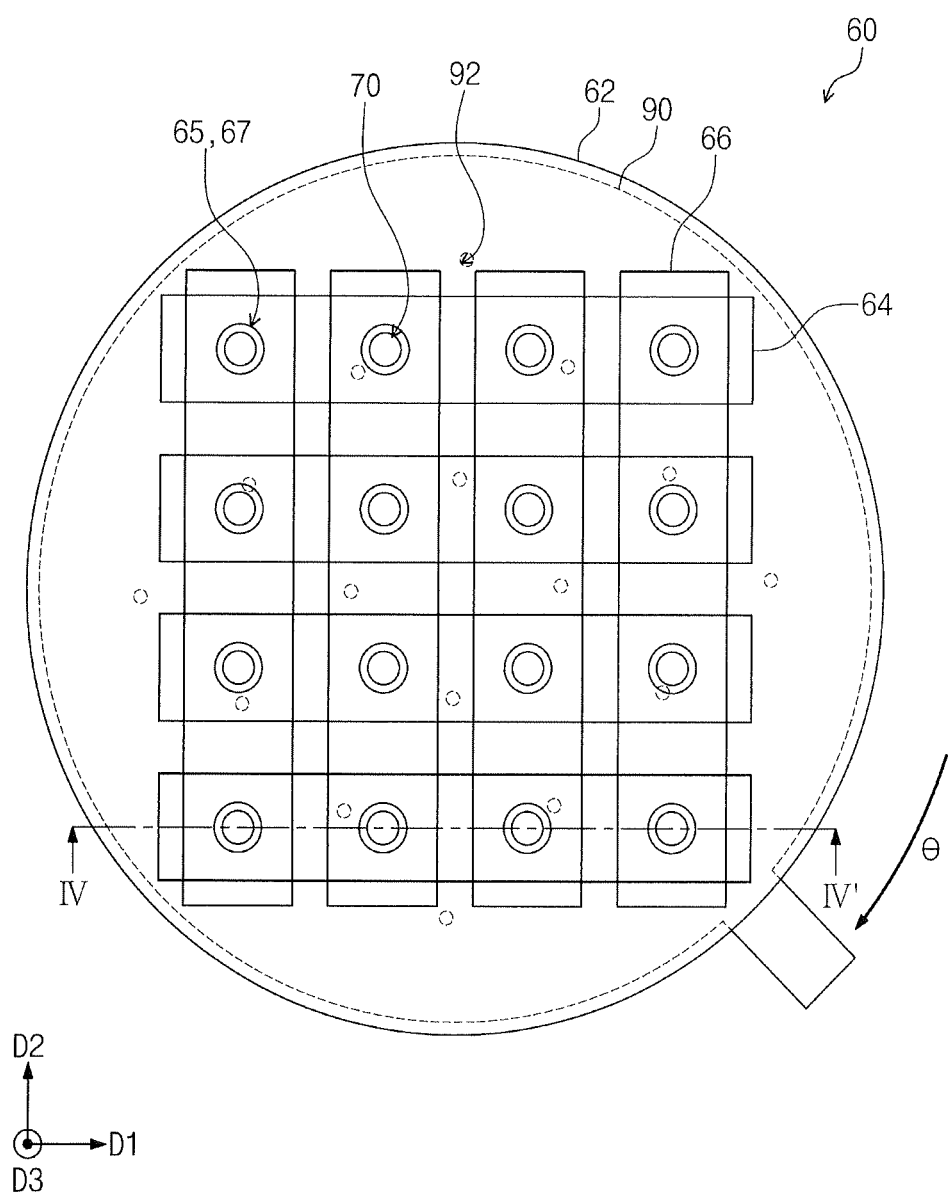
FIG. 10 illustrates a plan view showing a shutter plate of FIG. 8 in rotating to block cathode holes.
Figure 11:
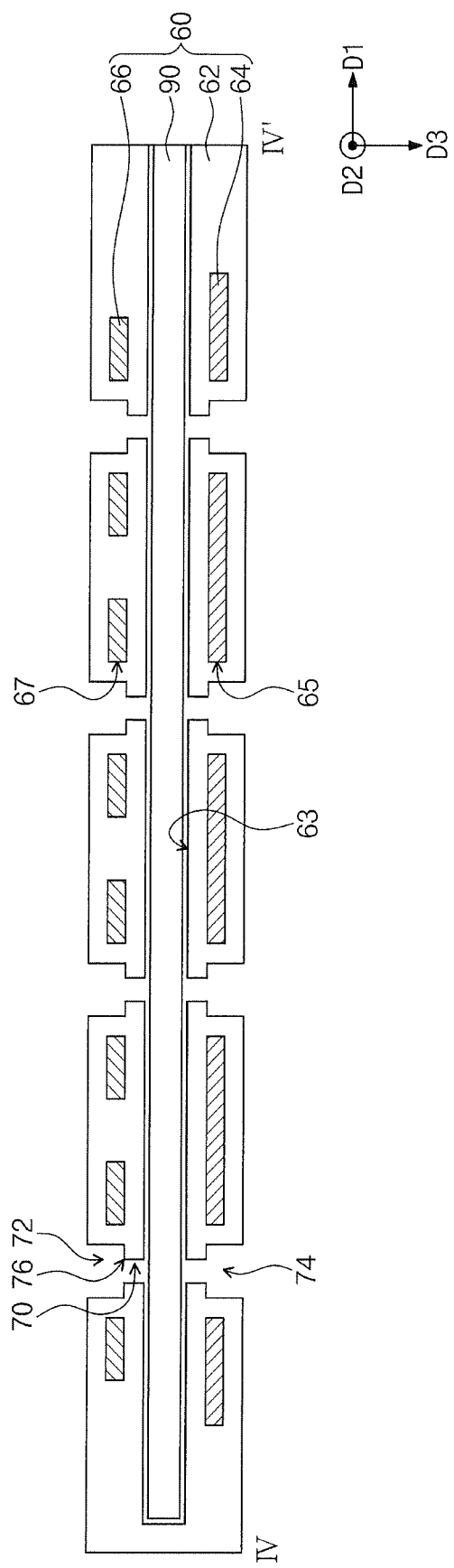
FIG. 11 illustrates a cross-sectional view taken along line IV-IV' of FIG. 10.

FIG. 10 shows the shutter plate 90 of FIG. 8 in rotating to block the cathode holes 70. FIG. 11 shows a cross-sectional view taken along line IV-IV' of FIG. 10.

Referring to FIGS. 10 and 11, when the shutter plate 90 rotates in a direction of azimuth angle θ, the shutter plate 90 may block the cathode holes 70. The shutter holes 92 may no longer be aligned with the cathode holes 70. The shutter plate 90 may interrupt the introduction of the reaction gas 22 into the cathode holes 70. Thus, even when the source power output 57 is provided to the top electrodes 66 and the bias power output 55 is provided to the bottom electrodes 64, the lower plasma 80 may not be generated in the cathode holes 70.

It will be described below a method of manufacturing a semiconductor device using the plasma processing apparatus 100 configured as describe above.

Figure 12:
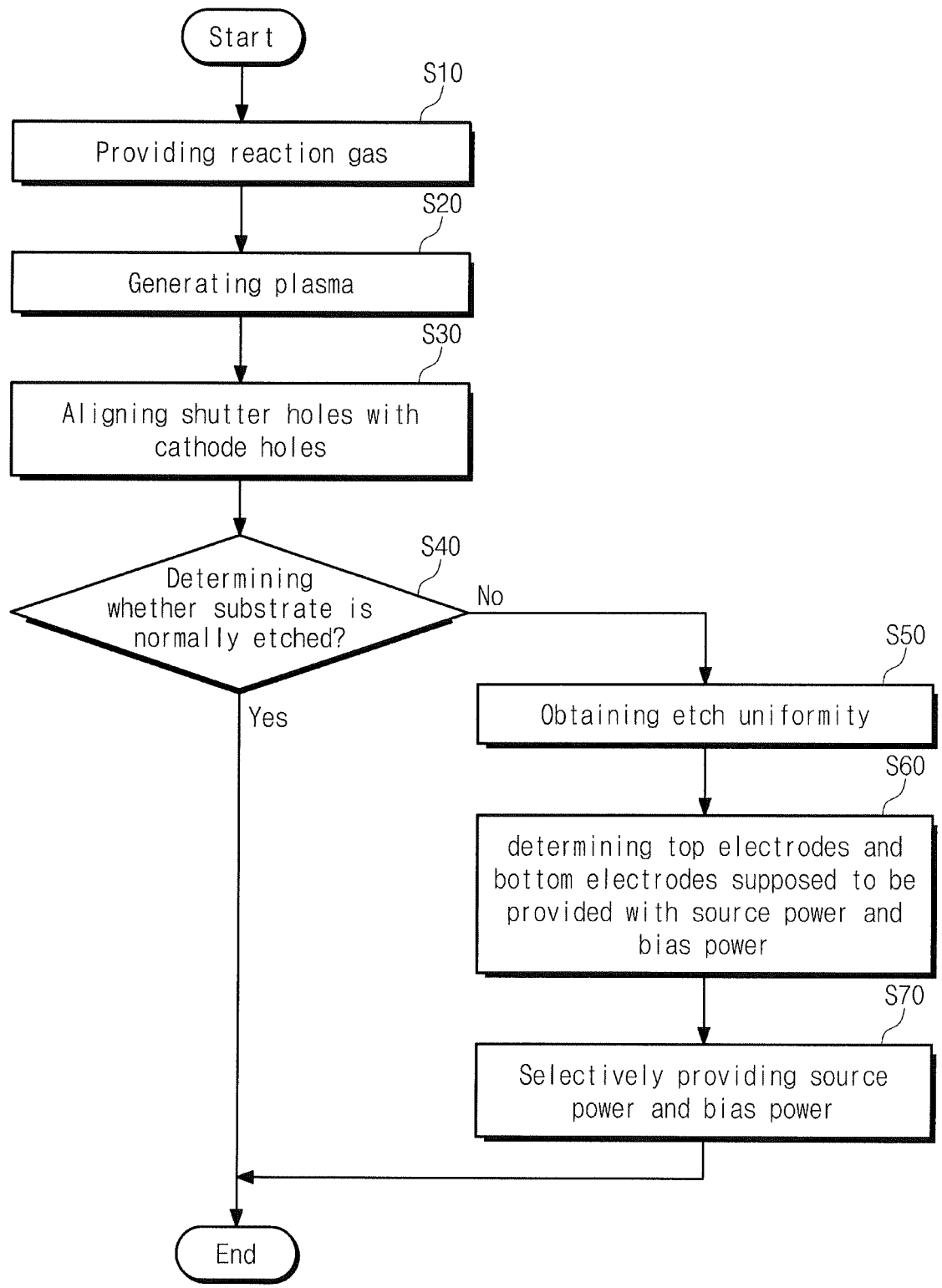
FIG. 12 illustrates a flow chart showing a method of manufacturing a semiconductor device according to exemplary embodiments of inventive concepts.

FIG. 12 shows a method of manufacturing a semiconductor device according to inventive concepts.

Referring to FIG. 12, a method of manufacturing a semiconductor device according to inventive concepts may include a step S10 of providing a reaction gas, a step S20 of generating an upper plasma, a step S30 of aligning shutter holes with cathode holes, a step S40 of determining whether a substrate is normally etched, a step S50 of assessing an etch uniformity of the substrate, a step S60 of determining if top electrodes and bottom electrodes should be provided with a source power output and a bias power output, and a step S70 of selectively providing the source power output and the bias power output.

Referring to FIGS. 1, 5 and 8-12, when the substrate W is provided on the electrostatic chuck 30, the gas supply 20 may provide the reaction gas 22 on the hollow cathode 60 in the chamber 10 (S10). The reaction gas 22 may be an etching gas, a deposition gas, an inert gas, or a purge gas.

The high-frequency power supply 52 may supply the high-frequency power output 53 to the plasma electrode 40, and therefore the upper plasma 42 may be generated between the plasma electrode 40 and the hollow cathode 60 (S20). The ions 24 and the radicals 26 of the reaction gas 22 may be produced in the upper plasma 42. A production amount of the ions 24 and the radicals 26 may increase in proportion to intensity of the upper plasma 42.

A controller (not shown) or human operator may align the shutter holes 92 of the shutter plate 90 and the cathode holes 70 of the hollow cathode 60 (S30). The cathode holes 70 of the hollow cathode 60 may filter the ions 24 in the upper plasma 42, and may allow the radicals 26 to pass therethrough toward the substrate W. The radicals 26 may pass through the cathode holes 70, and may then etch the substrate W. The radicals 26 may etch and minimally damage the substrate W.

When the etching of the substrate W is complete, an inspection apparatus (not shown) may inspect the substrate W to determine whether the substrate W is normally or abnormally etched (S40). If the inspection reveals that the substrate W has different etching depths depending on locations therein, the inspection apparatus may determine that the substrate W has been abnormally etched.

The inspection apparatus (not shown) may assess etch uniformity of the substrate W (S50). The etch uniformity may include a difference in etch rate depending on locations in the substrate W. Coordinate values may be given to indicate positional information about portions of the substrate W that have the difference etch rate.

The controller may determine if the bottom electrodes 64 and the top electrodes 66 should be supplied with the source power output 57 and the bias power output 55 on the basis of the etch uniformity (S60). The controller may one-to-one correspond coordinate values indicating positional information about portions of the substrate W to coordinate values indicating locations in the hollow cathode 60. For example, the controller may correspond coordinate values indicating positional information about portions of the substrate W to coordinate values indicating the cathode holes 70 at the intersections 68. The controller may determine the bottom electrodes 64 and the top electrodes 66 positioned corresponding to one or more specific portions of the substrate W whose etch rates are lower than an average etch rate of the substrate W. Alternatively, the controller may obtain intensities of the source power output 57 and the bias power output 55. When a particular portion of the substrate W is less the average etch rate, the controller may increase the intensities of the source power output 57 and the bias power output 55. In contrast, when a particular portion of the substrate W is greater than the average etch rate, the controller may decrease the intensities of the source power output 57 and the bias power output 55.

The source power supply 56 and the bias power supply 54 may selectively provide the source power output 57 and the bias power output 55 to the top electrodes 66 and the bottom electrodes 64 expressed by coordinate values having the difference in etch rate (S70). When the source power output 57 and the bias power output 55 generate the lower plasma 80 in the cathode holes 70, the lower plasma 80 may convert parts of the radicals 26 into the ions 24. The ions 24 may etch the substrate W at higher etch rate greater than that of the radicals 26. For example, the lower plasma 80 may fast etch locations in the substrate W that have low etch rate. Accordingly, the substrate W may increase in etch uniformity.

Figure 13:
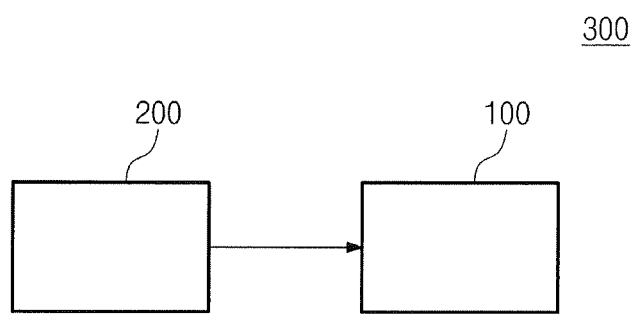
FIG. 13 illustrates a schematic diagram showing a semiconductor device manufacturing facility including the plasma processing apparatus of FIG. 1.

FIG. 13 is a semiconductor device manufacturing facility 300 including the plasma processing apparatus 100 of FIG. 1.

Referring to FIG. 13, the semiconductor device manufacturing facility 300 may include a lithography apparatus 200 and the plasma processing apparatus 100. The lithography apparatus 200 may form a resist pattern (not shown) on a substrate. For example, the lithography apparatus 200 may include a spin coater, a baker, a scanner, and a developer. The plasma processing apparatus 100 may etch portions of the substrate that are exposed through the resist pattern. Alternatively, the plasma processing apparatus 100 may include a plasma CVD apparatus. The plasma processing apparatus 100 may be installed ahead of the lithography apparatus 200, and may deposit a thin layer on the substrate.

A plasma processing apparatus according to inventive concepts may include a plasma electrode, a hollow cathode, a high-frequency power supply, and a bias power supply. The high-frequency power supply may supply the plasma electrode with a pushing power to provide a substrate with radicals of a reaction gas. The bias power supply may supply the hollow cathode with a pulling power to provide the substrate with ions of the reaction gas. A ratio between the ions and the radicals may correspond to a ratio between the pushing power and the pulling power. The bias power supply and the high-frequency power supply may control the ratio between the ions and the radicals.

The exemplary embodiments have been described in the specification and drawings. Although specific terms are used herein, they are merely used for the purpose of describing inventive concepts rather than limiting technical meanings or scopes of inventive concepts disclosed in the claims. Therefore, it will be appreciated by a person of ordinary skill in the art that various modifications and equivalent embodiments can be made from inventive concepts. Therefore, the authentic technical scope of inventive concepts to be protected shall be determined by the technical concepts of the accompanying claims.

What is claimed is:

1. A plasma processing apparatus, comprising:
   a chamber;

an electrostatic chuck in the chamber and loading a substrate;
a plasma electrode generating an upper plasma on the electrostatic chuck; and
a hollow cathode between the plasma electrode and the electrostatic chuck,
wherein the hollow cathode generates a lower plasma below the upper plasma, and
wherein the hollow cathode comprises:
- an insulation plate comprising cathode holes each having a size less than a thickness of a plasma sheath between the hollow cathode and the upper plasma;
- a bottom electrode in the insulation plate, wherein the bottom electrode comprises lower holes;
- a top electrode in the insulation plate disposed above the bottom electrode, wherein the top electrode comprises upper holes aligned with the lower holes,
- a shutter plate included in a gap between the top electrode and the bottom electrode, the shutter plate comprising shutter holes aligned with the cathode holes.

2. The plasma processing apparatus of claim 1, wherein the size of each of the cathode holes is equal to or less than 0.5 mm.

3. The plasma processing apparatus of claim 1, wherein each of the cathode holes has an entrance opening and an exit opening, wherein each of the entrance opening and the exit opening having a size greater than the size of each of the cathode holes, and wherein the size of each of the cathode holes being measured between the lower holes and the upper holes.

4. The plasma processing apparatus of claim 3, wherein the insulation plate has stepped inner walls in the cathode holes between the entrance opening and the exit opening.

5. The plasma processing apparatus of claim 4, wherein each of the stepped inner walls has a height equal to or less than 5 mm.

6. The plasma processing apparatus of claim 3, wherein the insulation plate has inclined inner walls in the cathode holes between the entrance opening and the exit opening.

7. The plasma processing apparatus of claim 1, wherein the hollow cathode further comprises bottom electrodes and top electrodes in the insulation plate,
wherein the bottom electrodes extend in a first direction,
wherein the top electrodes extend in a second direction intersecting the first direction, and
wherein the cathode holes, the lower holes, and the upper holes are disposed at intersections of the bottom electrodes and the top electrodes.

8. A plasma processing apparatus, comprising:
a chamber;
an electrostatic chuck in the chamber and loading a substrate;
a plasma electrode generating an upper plasma on the electrostatic chuck; and
a hollow cathode between the plasma electrode and the electrostatic chuck,
wherein the hollow cathode generates a lower plasma below the upper plasma,
wherein the hollow cathode comprises an insulation plate comprising:
cathode holes;
bottom electrodes that comprises lower holes having a size greater than that of the cathode holes;
top electrodes disposed above the bottom electrodes, the top electrodes comprising upper holes aligned with the lower holes; and
a shutter plate included in a gap between the top electrodes and the bottom electrodes, the shutter plate comprising shutter holes aligned with the cathode holes, and being configured to rotate in the insulation plate.

9. The plasma processing apparatus of claim 8, wherein the shutter holes are smaller than the cathode holes.

10. The plasma processing apparatus of claim 1, further comprising a bias power supply providing the bottom electrode with a bias power output.

11. The plasma processing apparatus of claim 1, further comprising a source power supply providing the top electrode with a source power output.

12. The plasma processing apparatus of claim 1, further comprising a high-frequency power supply providing the plasma electrode with a high-frequency power output.

13. The plasma processing apparatus of claim 1, wherein the cathode holes filter ions in the upper plasma, and allow radicals in the upper plasma to pass through the cathode holes.

14. The plasma processing apparatus of claim 1, wherein the chamber comprises:
a lower housing;
an upper housing on the lower housing; and
a ground plate disposed between the upper housing and the lower housing, wherein the ground plate supports the hollow cathode.

* * * * *